(12) United States Patent
Ohta

(10) Patent No.: US 8,500,302 B2
(45) Date of Patent: Aug. 6, 2013

(54) DISPLAY PANEL APPARATUS, DISPLAY APPARATUS, AND METHOD OF MANUFACTURING DISPLAY PANEL APPARATUS

(75) Inventor: Takashi Ohta, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/453,572

(22) Filed: Apr. 23, 2012

(65) Prior Publication Data

US 2012/0206916 A1 Aug. 16, 2012

Related U.S. Application Data

(63) Continuation of application No. PCT/JP2009/005682, filed on Oct. 28, 2009.

(51) Int. Cl.
*F21V 5/00* (2006.01)
(52) U.S. Cl.
USPC ....... 362/244; 362/84; 362/97.3; 362/249.02; 362/311.02; 313/504; 445/25
(58) Field of Classification Search
USPC .......... 362/23.07, 84, 97.3, 238, 244, 249.02, 362/311.02; 313/504; 445/25
See application file for complete search history.

(56) References Cited

U.S. PATENT DOCUMENTS

| | | | |
|---|---|---|---|
| 7,715,104 B2 | 5/2010 | Abe et al. | |
| 7,878,670 B2 * | 2/2011 | Shibasaki et al. | 362/84 |
| 7,978,413 B2 | 7/2011 | Abe et al. | |
| 2006/0215269 A1 | 9/2006 | Abe et al. | |
| 2009/0212011 A1 | 8/2009 | Abe et al. | |

FOREIGN PATENT DOCUMENTS

| | | |
|---|---|---|
| JP | 60-191012 | 12/1985 |
| JP | 05-333328 | 12/1993 |
| JP | 06-324317 | 11/1994 |
| JP | 11-067460 | 3/1999 |
| JP | 11-352468 | 12/1999 |
| JP | 2000-235178 | 8/2000 |
| JP | 2005-292583 | 10/2005 |
| JP | 2006-188388 | 7/2006 |
| JP | 2006-318807 | 11/2006 |
| JP | 2007-084349 | 4/2007 |
| JP | 2008-241992 | 10/2008 |

OTHER PUBLICATIONS

International Search Report in PCT/JP2009/005682, dated Jan. 19, 2010.

* cited by examiner

*Primary Examiner* — Stephen F Husar
(74) *Attorney, Agent, or Firm* — Greenblum & Bernstein, P.L.C.

(57) ABSTRACT

A display apparatus includes a substrate, organic electroluminescence units, and a lens sheet. The lens sheet includes a sheet base and lenses protruding from a surface of the sheet base. A transparent substrate is above the lens sheet, and a bonding layer that includes a resin bonds the lenses to the transparent substrate. Either the substrate or the organic electroluminescence units include an alignment mark. The lens sheet includes a groove formed between the lenses in the sheet base. The groove is used for alignment with the alignment mark. The resin covers a surface of each of the lenses and is filled into the groove. A boundary area between the sheet base and each of the lenses, which is located between a surface of a lens and the groove, is covered by the resin.

13 Claims, 15 Drawing Sheets

DISPLAY PANEL APPARATUS, DISPLAY APPARATUS, AND METHOD OF MANUFACTURING DISPLAY PANEL APPARATUS

CROSS REFERENCE TO RELATED APPLICATION

This is a continuation application of PCT application No. PCT/JP2009/005682 filed on Oct. 28, 2009, designating the United States of America.

BACKGROUND OF THE INVENTION (1) Field of the Invention

The present invention relates to structures of lens sheets included in display panel apparatuses having electroluminescence (hereinafter referred to as EL) elements.

(2) Description of the Related Art

As a conventional technique to improve light-extraction efficiency in a display panel apparatus including light emitting elements such as organic EL elements, a lens sheet having lenses is provided in a direction in which the light emitting elements emit light.

FIG. 1 shows an example of a structure of a conventional lens sheet.

A conventional lens sheet 500 shown in FIG. 1 includes a sheet base 501 in sheet form and lenses 502 protruding from a surface of the sheet base 501.

The lens sheet 500 is positioned in the light emitting direction of a substrate which has light emitting units including organic EL elements.

In positioning the lens sheet 500 with respect to the substrate as above, it is necessary to align the substrate and the lens sheet 500 with accuracy.

Specifically, with respect to the substrate, the lens sheet 500 needs to be positioned so that the lenses 502 are located precisely above the respective light emitting units in FIG. 1.

For this reason, the conventional lens sheet 500 has an alignment mark 503a and an alignment mark 503b, for example. The alignment mark 503a and the alignment mark 503b protrude in a direction which is the same as a direction in which the lenses 502 protrude from the surface of the sheet base 501, and these marks function as markings for aligning the lens sheet 500 with the substrate.

In joining the lens sheet 500 having the above structure to the substrate, positioning is performed so that, for example, in FIG. 1, the right end of the alignment mark 503a matches the right end of an alignment mark 603a provided on the substrate.

Furthermore, this positioning is followed by checking whether the right end of the alignment mark 503b matches the right end of the alignment mark 603b provided on the substrate in FIG. 1, for example.

These positioning and position checking are performed using results of analysis on data of images captured from above in FIG. 1, for example.

A technique related to a lens sheet having such protruding alignment marks has also been disclosed (see Japanese Patent Application Publication No. 11-352468).

SUMMARY OF THE INVENTION

In a display panel apparatus, a glass substrate, for example, is provided on the opposite side of the lens sheet from the substrate in which the light emitting elements are provided. This structure is described using the above conventional lens sheet 500.

FIG. 2 shows the conventional lens sheet 500 and the glass substrate which are bonded to each other.

For example, as shown in FIG. 2, the lens sheet 500 and the glass substrate are bonded via a bonding layer including a resin.

In the case where a resin is applied to the lens sheet 500 in order to bond the lens sheet 500 and the glass substrate, air bubbles may be generated on the surface of the sheet base 501 of the lens sheet 500.

For example, a boundary between the sheet base 501 and each of the lenses 502 is not smooth and has some angle and area to such an extent as to result in an air layer. This, along with other factors such as high viscosity of the resin, inhibits the resin from filling this boundary area, in which bubbles will therefore be generated.

For example, as shown in FIG. 2, a bubble is generated in the boundary area between the sheet base 501 and each of the lenses 502.

This bubble, in contact with each of the lenses 502, remaining on the surface of the sheet base 501 will, for example, adversely affects the preset refractive index of the lens 502 and results in degradation of intrinsically-expected light-extraction efficiency of the lens 502.

In addition, bubbles may be generated also in the boundary areas between the alignment marks 503a and 503b and the sheet base 501, and when these bubbles are close to the lenses 502, this may reduce the desired light-extraction efficiency of the lenses 502.

Accordingly, there has conventionally been a problem of how to reduce generation of these bubbles.

It is to be noted that removing the alignment mark 503a and the alignment mark 503b is not a realistic measure because they function as markings for aligning the lens sheet 500 with the substrate.

Furthermore, the alignment mark 503a and the alignment mark 503b are recognized typically by an optical method using data of captured images or the like as described above.

However, the alignment mark 503a and the alignment mark 503b protrude in a direction in which the images are captured, resulting in blurred images due to diffuse reflection of light or other reasons and thus leading to characteristics that it is difficult to obtain clear image data.

That is, the conventional technique has a problem of difficulty in improving accuracy of alignment of the lens sheet and the substrate in which the light emitting elements are arranged, because the recognition level for a part functioning as an alignment mark on the lens sheet side is not sufficiently high.

As described above, the conventional lens sheet is prone to bubbles and has difficulty in improving accuracy of alignment in bonding to another member such as the substrate.

In view of the above problems of the conventional technique, an object of the present invention is to provide a display panel apparatus and a display apparatus which use a lens sheet capable of accurate alignment with another member while maintaining the desired light-extraction efficiency.

In order to solve the above problems, a display panel apparatus according to an aspect of the present invention includes: a substrate; a plurality of organic electroluminescence (EL) units each of which includes a first electrode formed above the substrate, a second electrode that is a transparent electrode, and an organic luminescent layer interposed between the first electrode and the second electrode; a lens sheet including a sheet base and a plurality of lenses, the sheet base being provided (i) outside the second electrode that transmits light emitted from the organic luminescent layer and (ii) in a direction of the emitted light, and the lenses being provided for the respective organic EL units and protruding from a surface of the sheet base; a transparent substrate provided above the lens sheet; and a bonding layer formed across a top surface of the lens sheet and including a resin for providing a flat surface over unevenness resulting from the lenses and for bonding the lenses and the transparent substrate, wherein either the substrate or the organic EL units have an alignment mark for aligning the substrate with the lens sheet, the lens sheet has a groove formed between the lenses in the sheet base and recessed from the surface of the sheet base in a direction opposite to a direction in which the lenses protrude, and the groove formed between the lenses is used for alignment with the alignment mark, and the resin covers a surface of each of the lenses and is filled into the groove, and a boundary area between the sheet base and each of the lenses is covered by the resin, the boundary area being located between the surface of the lens and the groove.

In the display panel apparatus according to an aspect of the present invention, a groove is formed along a periphery of a region in which the lens is provided. As a result, the resin applied to a surface of each of the lenses is guided to the surface of the protruding lens and then led into the groove via the boundary area between the sheet base and the lens. This prevents at least generation of the bubbles which contact the lenses, with the result that the lenses can exhibit the intrinsically-expected light-extraction efficiency.

Furthermore, the groove is recessed in a direction opposite to the direction in which the lenses protrude. This facilitates recognition of an image captured from the side on which the lenses are present. Thus, accurate alignment can be achieved when this groove functions as an alignment mark on the lens sheet side in aligning the lens sheet and another member such as the substrate.

FURTHER INFORMATION ABOUT TECHNICAL BACKGROUND TO THIS APPLICATION

The disclosure of PCT application No. PCT/JP2009/005682 filed on Oct. 28, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
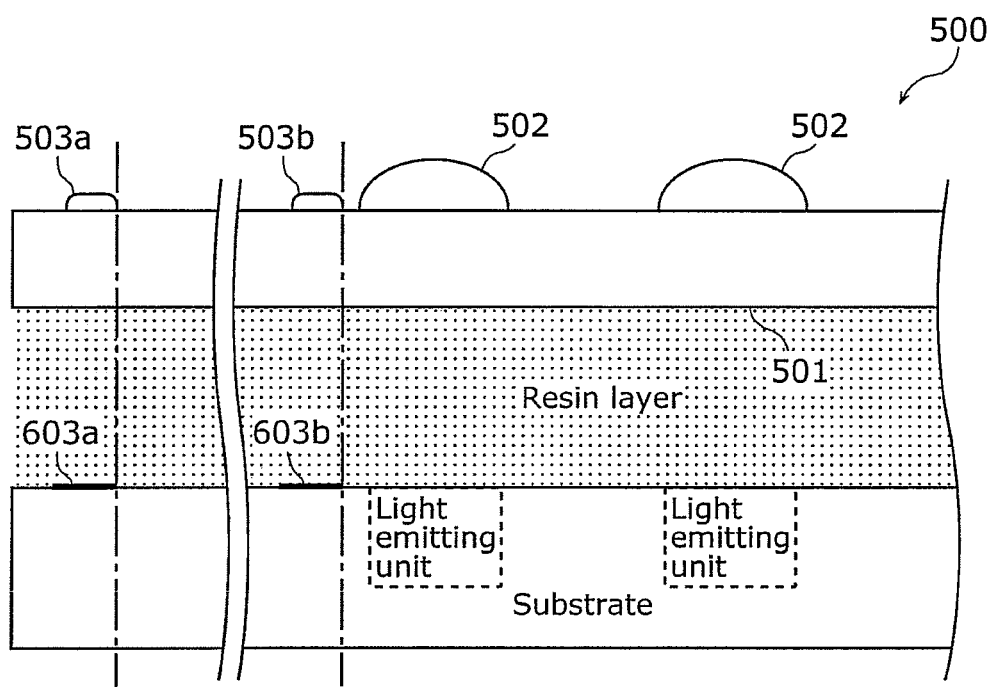
FIG. 1 shows an example of a structure of a conventional lens sheet.

A lens sheet according to an aspect of the present invention includes: a sheet base; lenses protruding from a surface of the sheet base; and a groove formed along a periphery of a region of the sheet base in which the lens is provided, and recessed from the surface of the sheet base in a direction opposite to a direction in which the lenses protrude.

In the case of manufacturing, for example, a display panel apparatus, using the lens sheet according to this aspect, a resin is applied, in the manufacturing process, to a surface of the lens sheet on which the lenses are provided, for the purpose of bonding thereto, for example, a glass substrate. As a result, a bonding layer is formed between the lens sheet and the glass substrate.

At this time, if the lens sheet is the conventional one, the resin will not fill the boundary area between the base of the lens sheet and each of the lenses, in which a bubble will therefore be generated. Conventionally, due to the existence of this bubble, the preset refractive index of the lens changes undesirably, causing a problem of degradation of intrinsically-expected light-extraction efficiency of the lens.

On the other hand, in the case of the lens sheet according to this aspect, the resin applied to the surface of each of the lenses is guided to the surface of the protruding lens and then sequentially led, via the boundary area between the sheet base and the lens, into the groove formed along the periphery of the region in which the lens is provided.

This prevents the generation of bubbles in the boundary area between the sheet base and each of the lenses, which, conventionally, used to prone to bubbles. As a result, a change in the preset refractive index of each of the lenses due to the bubbles will not occur, and the lenses can exhibit the intrinsically-expected light-extraction efficiency.

Furthermore, the groove is recessed in a direction opposite to the direction in which the lenses protrude. Thus, upon aligning the lens sheet with the substrate including light-emitting elements in the manufacturing process of the display panel apparatus, for example, the groove can be optically clearly recognized from the side on which the lenses are present.

Thus, accurate alignment can be achieved when this groove functions as an alignment mark on the lens sheet side at the time of alignment.

Furthermore, in the lens sheet according to an aspect of the present invention, a cross-section of the groove, which is perpendicular to the lengthwise direction thereof, is in the shape of an isosceles triangle with a vertex angle of 90 degrees.

According to this aspect, the cross-sectional profile of the groove is such an isosceles triangle as above, with the result that light entering from outside is reflected on one of the inclines of the isosceles triangle, and this reflected light is reflected on the other one of the inclines. As a result, the light can return in a direction to where it originally entered.

That is, the lens sheet according to this aspect can totally reflect light incident on the groove, in a direction to where the light originally entered. It is therefore possible to emit very bright light towards a camera or the like which captures an image of the groove. As a result, when the groove functions as an alignment mark on the lens sheet side for alignment with another member, optical recognition of the alignment mark can be easy, which can improve the accuracy of alignment of the lens sheet and another member.

Furthermore, in the lens sheet according to an aspect of the present invention, the groove is formed in the sheet base so that the surface of each of the lenses is continuous with a wall surface defining the groove.

In the lens sheet according to this aspect, the surface of each of the lenses is continuous with the wall surface defining the groove. In other words, the lens sheet according to this aspect is in such a form that it has a significantly reduced impediment to the resin flow in the boundary area between the sheet base and each of the lenses.

The resin is therefore guided along the surface of each of the lenses and smoothly falls in the groove because of the inclination of the surface of the lens. This further improves an effect of bubble prevention in the boundary area between the sheet base and each of the lenses.

Furthermore, in the lens sheet according to an aspect of the present invention, the groove is formed at a position such that a distance between an end edge, on the surface side of the sheet base, of the wall surface defining the groove, and an end of a region in which the lens is provided, is equal to or less than a predetermined distance.

The groove according to this embodiment is formed within a predetermined range from the end of the region in which the lens is provided. This means that, for example, even when there is a discontinuity between the surface of each of the lenses and the wall surface of the groove because they are not continuous with each other, the resin can be guided along the surface of the lens and fall in the groove by downward force as long as the groove is formed within the predetermined range from the end of the region in which the lens is provided. As a result, it is possible to prevent bubbles from being generated in the boundary area between the sheet base and each of the lenses.

Furthermore, in the lens sheet according to an aspect of the present invention, the sheet base is formed of the same material as the lenses.

According to this aspect, the sheet base is formed of the same material as the lenses. Thus, the sheet base is light transmissive. Consequently, most of the incident light to be used in the alignment with another member is reflected on the wall surface defining the groove, while passing through the sheet base in an area other than the groove.

An amount of the incident light transmitted by the sheet base is therefore different from the groove to the other area, which allows for a clear discrimination between the groove and the other area. As a result, the optical recognition of the groove serving as an alignment mark on the lens sheet side becomes easy, which can improve the accuracy of alignment of the lens sheet and another member.

Furthermore, in the lens sheet according to an aspect of the present invention, each of the lenses has a cross-sectional profile in the form of an elliptical arc having a predetermined curvature.

Furthermore, the display panel device according to an aspect of the present invention includes: a substrate; an organic electroluminescence (EL) unit including a first electrode formed above the substrate, a second electrode that is a transparent electrode, and an organic luminescent layer interposed between the first electrode and the second electrode; and a lens sheet including a sheet base and lenses, the sheet base being provided (i) outside the second electrode that transmits light emitted from the organic luminescent layer and (ii) in a direction of the emitted light, and the lenses protruding from a surface of the sheet base, wherein each of the substrate and the organic EL unit has an alignment mark for aligning the substrate with the lens sheet, the lens sheet is formed along a periphery of a region of the sheet base in which the lens is provided, and has a groove recessed in a direction opposite to a direction in which the lenses protrude from a surface of the sheet base, and the groove of the lens sheet is used for the alignment with the alignment mark.

In the display panel device according to this aspect, the lens sheet is formed along the periphery of the region on the surface of the sheet base in which the lens is provided, and has the groove recessed in the direction opposite to the direction in which the lenses protrude. This allows the groove to function as an alignment mark for use in the alignment with the alignment mark on the substrate side.

Furthermore, in a manufacturing process of the display panel apparatus according to this aspect, a resin is applied to a surface of the lens sheet on which the lenses are present, for the purpose of bonding thereto another substrate. At this time, with the conventional technique, the resin will not fill the boundary area between the sheet base and each of the lenses, in which bubbles will therefore be generated. Conventionally, due to the existence of these bubbles, the preset refractive index of each of the lenses changes undesirably, causing a problem of degradation of intrinsically-expected light-extraction efficiency of the lenses.

On the other hand, according to this aspect, the resin is guided along the surface of each of the lenses and falls in the groove formed along the periphery of the region in which the lens is provided. That is, the resin fully fills the boundary area between the sheet base and each of the lenses, with the result that generation of bubbles is prevented.

In other words, the groove of the lens sheet according to this aspect has a function of an alignment mark as well as a function of a guide face for leading the resin guided along the surface of each of the lenses to the boundary area between the sheet base and the lens.

Thus, in the display panel apparatus according to this aspect, the lens sheet is aligned accurately with the substrate on which the organic luminescent layer and the like are formed, and the desired lens efficiency of light extraction by the lens sheet is maintained.

Furthermore, the display panel apparatus according to an aspect of the present invention includes a bonding layer formed across a top surface of the lens sheet and including a resin for providing a flat surface over unevenness resulting from the lenses and for bonding the lenses to another member, and the groove is filled with the resin along the periphery of the region in which the lens is provided.

According to this aspect, a resin is used to bond the lens sheet to the substrate. It is therefore conceivable that a bubble is generated in the boundary area between the sheet base and each of the lenses, for example. However, according to this aspect, the resin around the region in which the lens is provided is filled into the groove.

Thus, when the resin is filled into the groove as above, the resin fills the boundary area; in other words, the resin is brought into dense contact with the boundary area, with the result that generation of bubbles in this area is prevented.

As a result, a change in the refractive index of each of the lenses due to bubbles is prevented, and the desired light-extraction efficiency is maintained.

Furthermore, in order to guide the resin to the boundary area between the sheet base and each of the lenses, instead of providing another guide member, the groove is used which functions as an alignment mark and is formed along the periphery of the region in which the lens is provided. This allows the boundary area to be filled with the resin without increasing a thickness of a film stacked on the substrate in the display panel apparatus, for example. It is therefore possible to efficiently extract light by preventing a change in the properties of the lenses while keeping the film thickness from increasing.

Furthermore, in the display panel apparatus according to an aspect of the present invention, the groove is filled with the resin guided along the surface of each of the lenses so that the resin fills the boundary area between the sheet base and the lens.

According to this aspect, the groove is filled with the resin guided along the surface of each of the lenses so that the resin fills the boundary area between the sheet base and the lens. That is, the resin is guided along the surface of each of the lenses by force of flow into the groove to completely fill the boundary area between the sheet base and the lens. This prevents generation of bubbles in the boundary area. As a result, a change in the refractive index of each of the lenses due to bubbles is prevented, which allows for efficient extraction of light.

Furthermore, in the display panel apparatus according to an aspect of the present invention, the sheet base has a refractive index higher than a refractive index of the bonding layer.

According to this aspect, since the sheet base has a refractive index higher than a refractive index of the bonding layer, it is possible to reduce an amount of light which is totally reflected on an interface between each of the lenses and the bonding layer, out of the light transmitted from the lenses to the bonding layer, and thus possible to extract as much light emitted from the organic luminescent layer as possible. As a result, the lenses can optimally extract the light emitted from the organic luminescent layer.

Furthermore, in the display panel apparatus according to an aspect of the present invention, each of the lenses has an elongated shape when viewed in a top plan, a cross-section of the lens, which is perpendicular to a lengthwise direction thereof, is in the form of an elliptical arc having a predetermined curvature, and a proportion of a height from a basal plane to a vertex of the lens to a semi-minor axis of the basal plane of the lens is 0.8 or more and 1.2 or less.

Each of the lenses according to this aspect has a configuration satisfying the above range constraints and therefore totally reflects a reduced amount of light on the lens interface, out of the light emitted from the organic luminescent layer, and can thus deflect the light to the bonding layer side, as compared to the case of other configurations. It therefore becomes possible to efficiently extract light emitted from the organic luminescent layer, so that the amount of extracted light can be increased as compared to the case of other configurations.

Furthermore, in the display panel apparatus according to an aspect of the present invention, the organic EL unit further includes a sealing layer above the second electrode, and the alignment mark is formed on the sealing layer.

Furthermore, in the display panel apparatus according to an aspect of the present invention, the alignment mark is formed on a top surface of the substrate.

That is, the alignment mark to be provided on the substrate side to align the substrate and the lens sheet may either be formed in any element formed or provided above the substrate or be formed on the substrate itself as long as the alignment mark is optically recognizable.

Furthermore, in the display panel apparatus according to an aspect of the present invention, the organic EL unit further includes a hole injection layer formed between the organic luminescent layer and the first electrode.

Furthermore, the display apparatus according to an aspect of the present invention includes the display panel apparatus according to any one of the above aspects, the display panel apparatus includes the plurality of the organic EL units, and the organic EL units are arranged in a matrix.

The display apparatus according to this aspect is implemented as, for example, a television, and is thus capable of providing viewers with clear images.

The following describes an embodiment of the present invention with reference to the drawings.

First, with reference to FIGS. 3 to 8, a lens sheet 100 according to an embodiment of the present invention is described.

Figure 3:
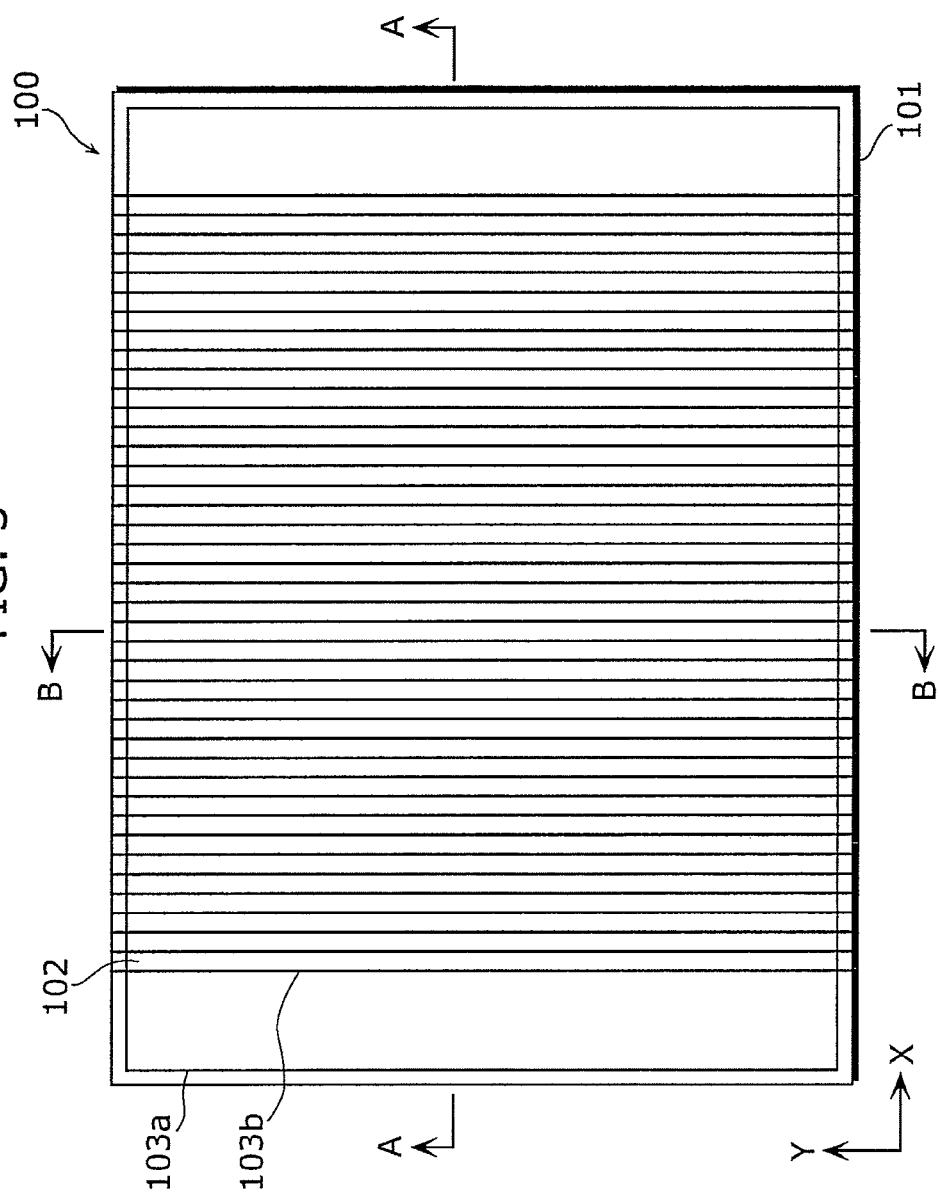
FIG. 3 is a plan view showing a schematic structure of a lens sheet according to an embodiment of the present invention.

FIG. 3 is a plan view showing a schematic structure of the lens sheet 100 according to the embodiment of the present invention.

Figure 4:
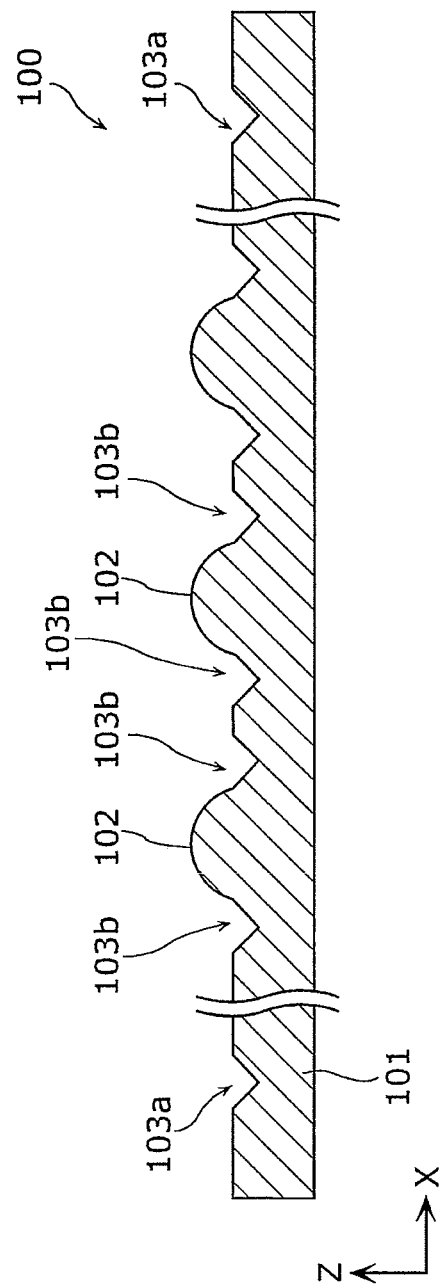
FIG. 4 shows a schematic cross-sectional profile of the lens sheet taken along line A-A of FIG. 3.

FIG. 4 shows a schematic cross-sectional profile of the lens sheet 100 taken along line A-A of FIG. 3.

The lens sheet 100 according to the embodiment of the present invention is a sheet for efficiently extracting light from a plurality of light emitting elements arranged in a back-side direction (in a direction in which lenses 102 are not provided).

As shown in FIGS. 3 and 4, the lens sheet 100 includes a sheet base 101 that is a sheet-like base, the lenses 102, and grooves 103a and 103b.

The lenses 102 are formed protruding from a surface of the sheet base 101. The groove 103b is formed along the periphery of a region of the sheet base 101 in which the lens 102 is provided. The groove 103a is formed in the shape of a rectangle along the periphery of the sheet base 101.

Both the groove 103a and the groove 103b function also as constituent elements for preventing generation of bubbles on the surface of the sheet base 101.

In addition, the groove 103a and the groove 103b further function as alignment marks provided on the lens sheet 100 side to align the lens sheet 100 and the later-described substrate.

Furthermore, each of the lenses 102 has, as a whole, an elongated shape in the Y-axis direction as shown in FIG. 3. That is, each of the lenses 102 has an elongated shape when viewed in a top plan (with the Z-axis direction as the vertical direction). Furthermore, as shown in FIG. 4, the upper part of a cross-section, parallel to the X-Z plane, of each of the lenses 102, is defined by a curve which is highest at the middle part in the X-axis direction.

Figure 5:
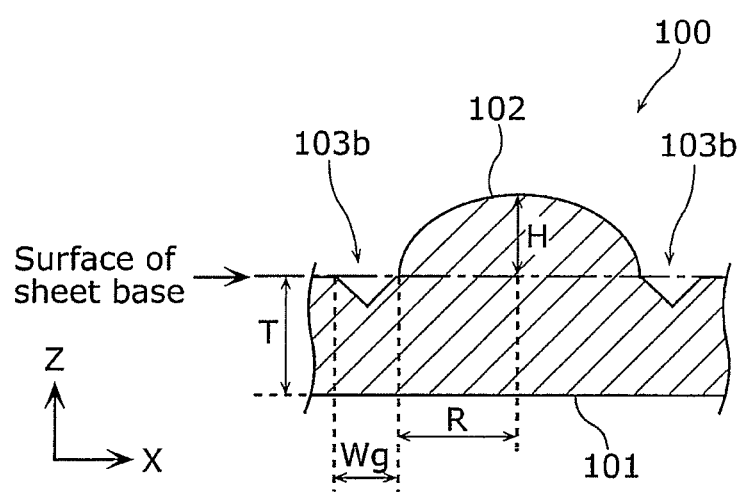
FIG. 5 shows positioning relation of a lens and grooves in a sheet base in the embodiment of the present invention.

Specifically, in the present embodiment, the cross-section of each of the lenses 102, perpendicular to the lengthwise direction thereof (or parallel to the X-Z plane in FIG. 4), is in the form of an elliptical arc having a predetermined curvature as shown in FIG. 5. It is to be noted that the term "elliptical arc" includes "circular arc".

In the lens sheet 100, the plurality of the lenses 102 configured as above are arranged in the X-axis direction, and the grooves 103b are formed on both sides of each of the arranged lenses 102.

The X-axis direction, the Y-axis direction, and the Z-axis direction are defined by, for example, the following correspondence relations. The X-axis direction corresponds to the horizontal direction (right-to-left or left-to-right direction), the Y-axis direction corresponds to the vertical direction, and the Z-axis direction corresponds to the front-back direction, of the display panel apparatus of a television, for example, with the lens sheet 100 embedded therein.

Note that, since each of the drawings including FIGS. 3 and 4 is illustrative of positioning relation and structures of the elements constituting the lens sheet 100 according to the embodiment, the number of elements and dimensional ratios of the elements in the respective directions in the drawings are not necessarily equal to actual ones.

FIG. 5 shows positioning relation of the lens 102 and the grooves 103b in the sheet base 101 in the embodiment of the present invention.

As shown in FIG. 5, the lens 102 is formed protruding from the surface of the sheet base 101, and the grooves 103b are formed being recessed from the surface of the sheet base 101 in the direction opposite to the direction in which the lens 102 protrudes.

In the present embodiment, the lens sheet 100 is molded from an acrylic resin, for example, and the sheet base 101 and the lenses 102 are thus integrated with each other. That is, the sheet base 101 is formed of the same material as the lenses 102. It can also be said that a part which protrudes from the surface of the sheet base 101 functions as the lens 102.

Furthermore, a proportion of a height (denoted by H in FIG. 5) from a basal plane to a vertex of the lens 102 to a semi-minor axis (denoted by R in FIG. 5) of the basal plane of the lens 102 is 0.8 or more and 1.2 or less. That is, R:H=1:0.8 to 1:1.2.

As an example of specific dimensions, the height H is about 40 μm and the semi-minor axis R is about 40 μm.

Furthermore, each of the lenses 102 has an elongated shape in the Y-axis direction as shown in FIG. 3. This means that the basal plane of the lens 102 has also an elongated shape in the Y-axis direction. Thus, in the present embodiment, a distance from an end of the lens 102 in the X-axis direction to an intersection of the basal plane of the lens 102 with a segment which extends through the vertex located in the middle of the lens 102 in the X-axis direction and is perpendicular to the basal plane, is referred to as the semi-minor axis (which is denoted by R in FIG. 5). That is, in the present embodiment, the semi-minor axis is half the width of the lens 102 in the X-axis direction.

The lens 102 in the present embodiment has a configuration with the proportion of the height H to the semi-minor axis R which satisfies the above range constraints, and therefore totally reflects a reduced amount of light on the interface of the lens 102, out of the light emitted from the organic luminescent layer 204, and can thus deflect the light to the bonding layer 270 side, as compared to the case of other configurations. It therefore becomes possible to efficiently extract light emitted from the organic luminescent layer 204, so that the amount of extracted light can be increased as compared to the case of other configurations.

The width (denoted by Wg in FIG. 5) of the groove 103b is about 3 μm, for example, and the thickness (denoted by T in FIG. 5) of the sheet base 101 is about 50 μm, for example.

Furthermore, as shown in FIG. 5, in the present embodiment, the groove 103b is formed in the sheet base 101 so that the surface of the lens 102 is continuous with a wall surface defining the groove 103b.

When the lens sheet 100 having the above-described structure is incorporated in the display panel apparatus or the like, a glass substrate, for example, is bonded to the surface of the lens sheet 100 on which the lenses 102 are provided.

Figure 6:
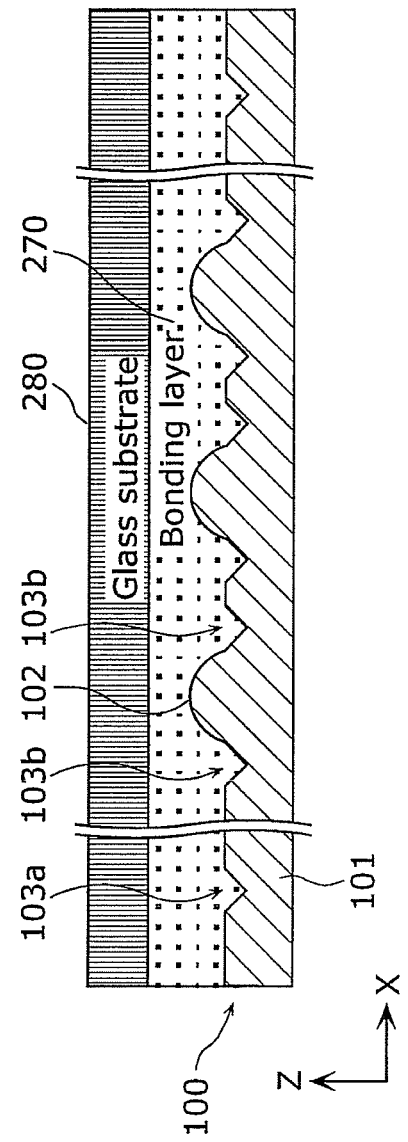
FIG. 6 is the first cross-section diagram showing the lens sheet and the glass substrate which are bonded in the embodiment of the present invention.

FIG. 6 is the first cross-section diagram showing the lens sheet 100 and a glass substrate 280 which are bonded in the embodiment of the present invention.

Figure 7:
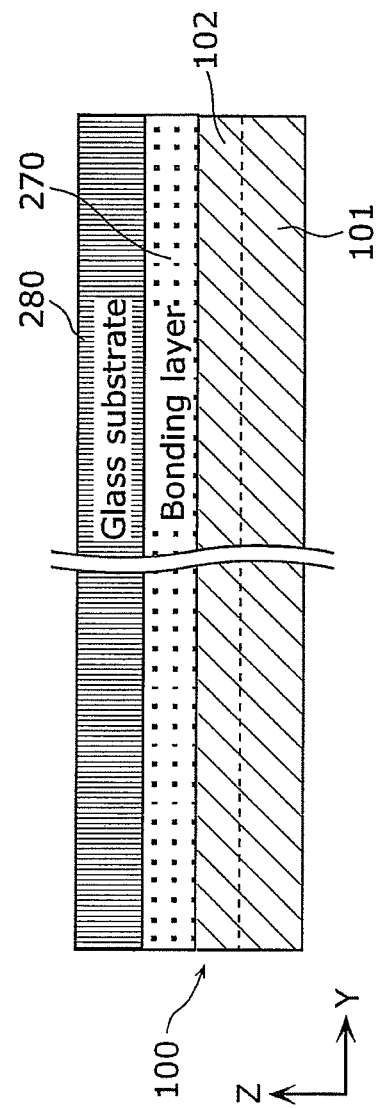
FIG. 7 is the second cross-section diagram showing the lens sheet and the glass substrate which are bonded in the embodiment of the present invention.

FIG. 7 is the second cross-section diagram showing the lens sheet 100 and the glass substrate 280 which are bonded in the embodiment of the present invention.

FIG. 6 shows the cross-section taken along line A-A of FIG. 3, and FIG. 7 shows the cross-section taken along line B-B of FIG. 3.

When the lens sheet 100 is bonded to the glass substrate 280, a resin is applied, for example, to the surface of the lens sheet 100 on which the lenses 102 are present, and on the applied resin, the glass substrate 280 is placed. That is, the bonding layer 270 is formed between the lens sheet 100 and the glass substrate 280.

Figure 2:
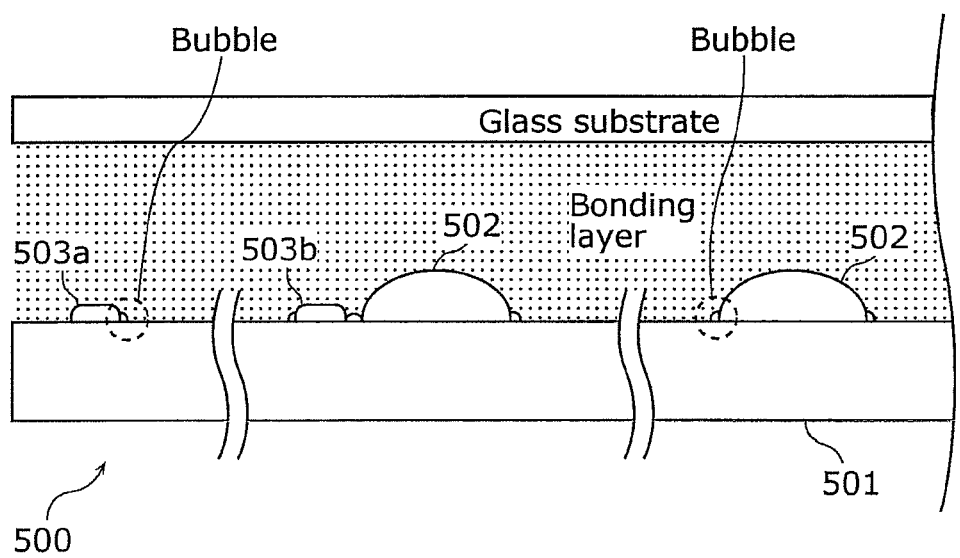
FIG. 2 shows the conventional lens sheet and the glass substrate which are bonded to each other.

Conventionally, in the case where the bonding layer is formed on the lens sheet, there is a possibility that a bobble is generated on the lens sheet as described above with reference to FIG. 2. On the other hand, the lens sheet 100 according to the present embodiment has a characteristic structure which can prevent generation of bubbles at least at such positions that the refractive index of each of the lenses 102 is affected.

Figure 8:
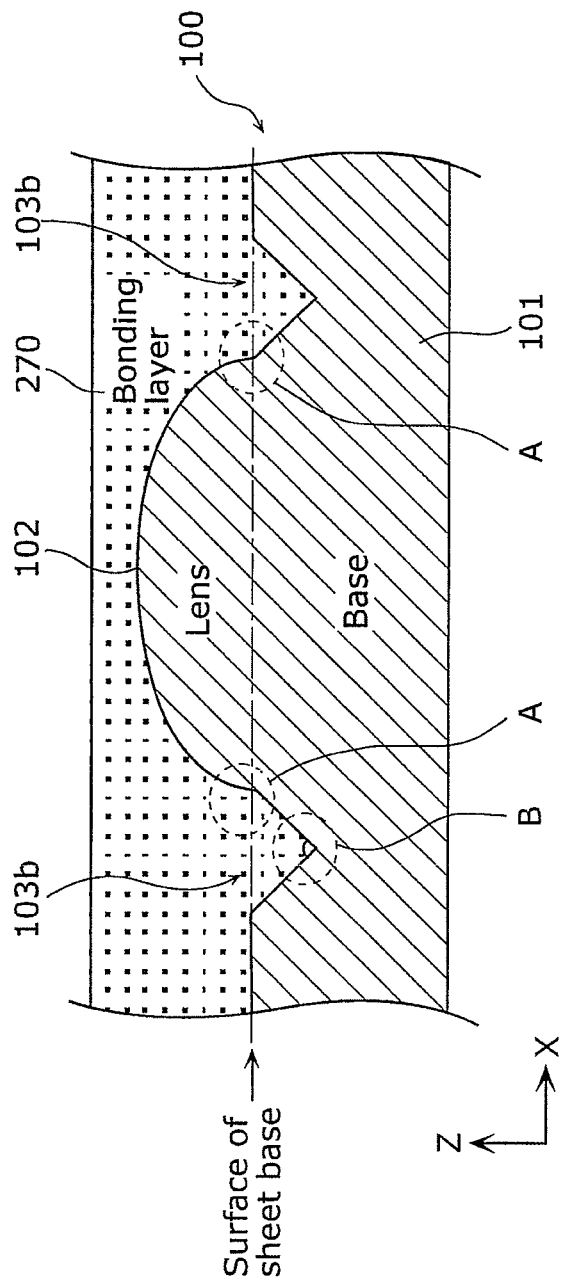
FIG. 8 shows an example of a cross-section of a bonding layer formed on the lens sheet in the embodiment of the present invention.

FIG. 8 shows an example of a cross-section of the bonding layer 270 formed on the lens sheet 100 in the embodiment of the present invention.

As shown in FIGS. 3 and 8 and other relevant drawings, the groove 103b is formed along the periphery of the region of the sheet base 101 in which the lens 102 is provided, and recessed from the surface of the sheet base 101 in the direction opposite to the direction in which the lens 102 protrudes.

As a result, the resin applied to the surface of each of the lenses 102 is guided to the surface of the protruding lens 102 and then sequentially led into the groove 103b via the boundary area (the area denoted by A in FIG. 8) between the sheet base 101 and the lens 102.

Accordingly, the generation of bubbles in the boundary area A which is conventionally prone to bubbles is prevented.

As a result, a change in the preset refractive index of the lens 102 due to the bubbles will not occur, and the lens 102 can exhibit the intrinsically-expected light-extraction efficiency.

While a bubble may conceivably be generated at the bottom of the groove 103b (the area denoted by B in FIG. 8), the bubble supposedly generated at the bottom B will be located at a level lower than the surface of the sheet base 101 (in a direction opposite to the direction in which the lens 102 protrudes). This bubble will therefore not adversely affect the refractive index of the lens 102 located at a level higher than the surface of the sheet base 101.

Furthermore, in the present embodiment, as shown in FIG. 8, the wall surface defining the groove 103b is continuous with the surface of the lens 102.

This allows the resin to more smoothly move from the surface of the sheet base 101 into the groove 103b. This means that the resin can more reliably fill the boundary area A. Thus, when the wall surface defining the groove 103b is continuous with the surface of the lens 102, the effect of preventing generation of bubbles in the boundary area A improves.

As above, in the lens sheet 100 according to the embodiment of the present invention, the groove 103b is formed along the periphery of the region of the sheet base 101 in which the lens 102 is provided. This groove 103b is recessed from the surface of the sheet base 101 in a direction opposite to the direction in which the lens 102 protrudes.

The lens sheet 100 has such a characteristic structure as above and therefore prevents generation of bubbles in the boundary area between the sheet base 101 and the lens 102 as described above, with the result that the lens 102 can exhibit the desired light-extraction efficiency.

The groove 103a (refer to FIGS. 3 and 4) is also recessed from the surface of the sheet base 101 in a direction opposite to the direction in which the lenses 102 protrude. Thus, the groove 103a also has a function of preventing generation of bubbles on the surface of the sheet base 101.

That is, in the case where the groove 103a is in proximity to the region in which the lens 102 is provided, the generation of bubbles in an area of the lens 102 close to the groove 103a is suppressed.

These grooves 103a and 103b not only function as constituent elements for preventing generation of bubbles as described above, but also function as alignment marks provided on the lens sheet 100 side to align the lens sheet 100 and the substrate in a manufacturing process of the display panel apparatus, for example.

The following describes a display panel apparatus 300 according to the embodiment of the present invention with reference to FIGS. 9 to 14.

Figure 9:
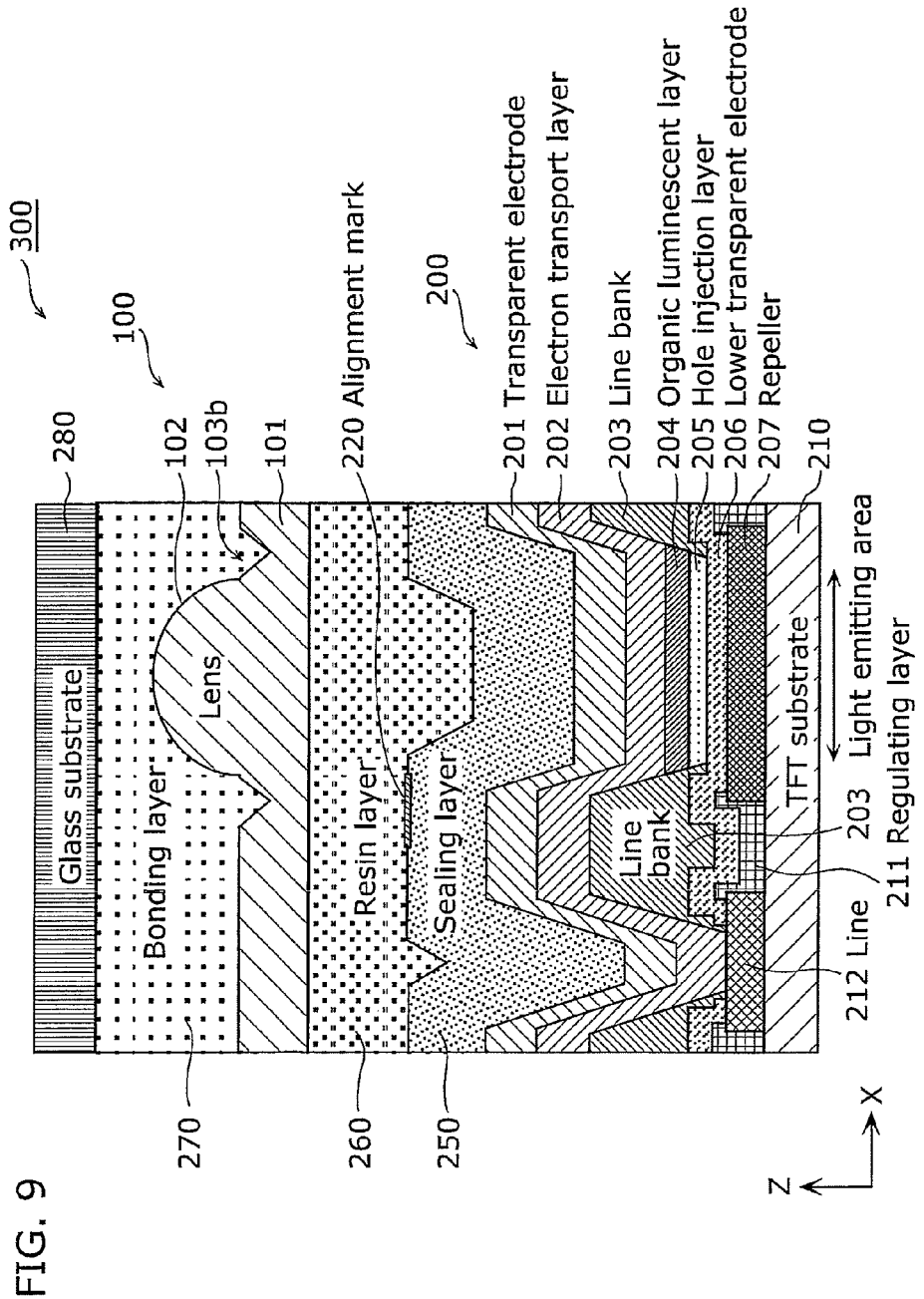
FIG. 9 is a schematic cross-section diagram of a display panel apparatus according to the embodiment of the present invention.

FIG. 9 is a schematic cross-section diagram of the display panel apparatus 300 according to the embodiment of the present invention.

FIG. 9 is an illustrative schematic diagram showing a cross-sectional structure of the display panel apparatus 300 according to the embodiment. Absolute positions of the elements and dimensional ratios of the elements in the respective directions in FIG. 9 are therefore not necessarily equal to actual ones.

The display panel apparatus 300 shown in FIG. 9 is an organic functional device provided with an organic EL unit which includes an anode, a cathode, and an organic luminescent layer interposed between the anode and the cathode.

Specifically, the display panel apparatus 300 includes: a TFT substrate 210 which includes a thin-film transistor (TFT) for driving; an organic EL unit 200; and the lens sheet 100.

As shown in FIG. 9, the display panel apparatus 300 includes: the TFT substrate 210; a line 212 for supplying a voltage to a later-described transparent electrode 201; a regulating layer 211 for regulating a pixel region; a repeller 207 made of an alloy of Ag, Pd, and Cu (APC); a lower transparent electrode 206 made of indium tin oxide (ITO); a hole injection layer 205 made of tungsten oxide; a line bank 203 made of a photosensitive resin; the organic luminescent layer 204 including an organic electroluminescent material; a electron transport layer 202; the transparent electrode 201 made of ITO; a sealing layer 250; a resin layer 260; the lens sheet 100; the bonding layer 270; and the glass substrate 280.

The lens sheet 100 includes the above-described elements. Specifically, the lens sheet 100 includes: the sheet base 101 provided outside the transparent electrode 201 that transmits light emitted from the organic luminescent layer 204, and provided in a direction of the emitted light; the lens 102 protruding from a surface of the sheet base 101 which is opposite to the TFT substrate 210; and the groove 103b for use in alignment with the alignment mark 220, formed along the periphery of the sheet base 101 in which the lens 102 is provided, and recessed from the surface of the sheet base 101 in a direction opposite to a direction in which the lens 102 protrudes.

The repeller 207 is an example of the first electrode in the display panel apparatus according to an implementation of the present invention, and the transparent electrode 201 is an example of the second electrode in the display panel apparatus according to an implementation of the present invention.

A configuration which includes at least the repeller 207, the transparent electrode 201, and the organic electroluminescent layer 204 is referred to as the organic EL unit 200.

The organic EL unit 200 may indicate a configuration which includes not only the above three elements but also elements shown in FIG. 9 which are formed or provided up to the sealing layer 250 above the TFT substrate 210.

Furthermore, the TFT substrate 210 or the organic EL unit 200 has the alignment mark 220. Specifically, in the present embodiment, the alignment mark 220 is applied to the top surface of the sealing layer 250 formed above the TFT substrate 210.

The alignment mark 220 may be present at any position between the top surface of the sealing layer 250 and the top surface of the TFT substrate 210 as long as the alignment mark 220 is optically recognizable from above the glass substrate 280. For example, the alignment mark 220 may be applied directly to the top surface of the TFT substrate 210.

This alignment mark 220 is used for alignment with the groove 103b of the lens sheet 100. For example, when the right end of the groove 103b is aligned with the right end of the alignment mark 220 in FIG. 9, this means that TFT substrate 210 and the lens sheet 100 are correctly aligned.

That is, in this case, the lens 102 is placed at the proper position right above the organic luminescent layer 204 for the lens 102.

In FIG. 9, in order to clearly show the alignment mark 220, a cross-section having a certain thickness is drawn as the alignment mark 220. However, the alignment mark 220 only needs to be optically recognizable from above as described earlier and therefore is implemented as, for example, a line applied to the sealing layer 250. The organic luminescent layer 204 is one of a layer which emits red light, a layer which emits green light, and a layer which emits blue light. For example, the organic luminescent layer 204 has a laminated structure which includes a 60 nm-thick lower layer of a-NPD (Bis[N-(1-naphthyl)-N-phenyl]benzidine) and a 70 nm-thick upper layer of Alq3(tris-(8-hydroxyquinoline)aluminum).

While FIG. 9 shows one organic EL unit 200, the organic EL units 200 are arranged in a matrix above the TFT substrate 210. Alignment of the lens sheet 100 with the TFT substrate 210 above which the organic EL units 200 are arranged in a matrix is described later with reference to FIGS. 12 and 13.

Furthermore, the bonding layer 270 is formed across the top surface of the lens sheet 100 and includes a resin for providing a flat surface over unevenness resulting from the lenses 102 and for bonding the lenses 102 to the glass substrate 280. At this time, as described above, the resin applied to the surface of each of the lenses 102 is guided to the surface of the protruding lens 102 and fills the boundary area (the area denoted by A in FIG. 8) between the sheet base 101 and the lens 102. Accordingly, the generation of bubbles in the boundary area A which is conventionally prone to bubbles is prevented, with the result that a change in the preset refractive index of the lens 102 due to the bubbles will not occur, and the lens 102 can exhibit the intrinsically-expected light-extraction efficiency.

In the present embodiment, the sheet base 101 has a refractive index higher than a refractive index of the bonding layer 270. This makes it possible to reduce an amount of light which is totally reflected on an interface between each of the lenses 102 and the bonding layer 270, out of the light transmitted from the lenses 102 to the bonding layer 270, and thus possible to extract as much light emitted from the organic luminescent layer 204 as possible.

As a result, the lens 102 can optimally extract the light emitted from the organic luminescent layer 204.

Figure 10:
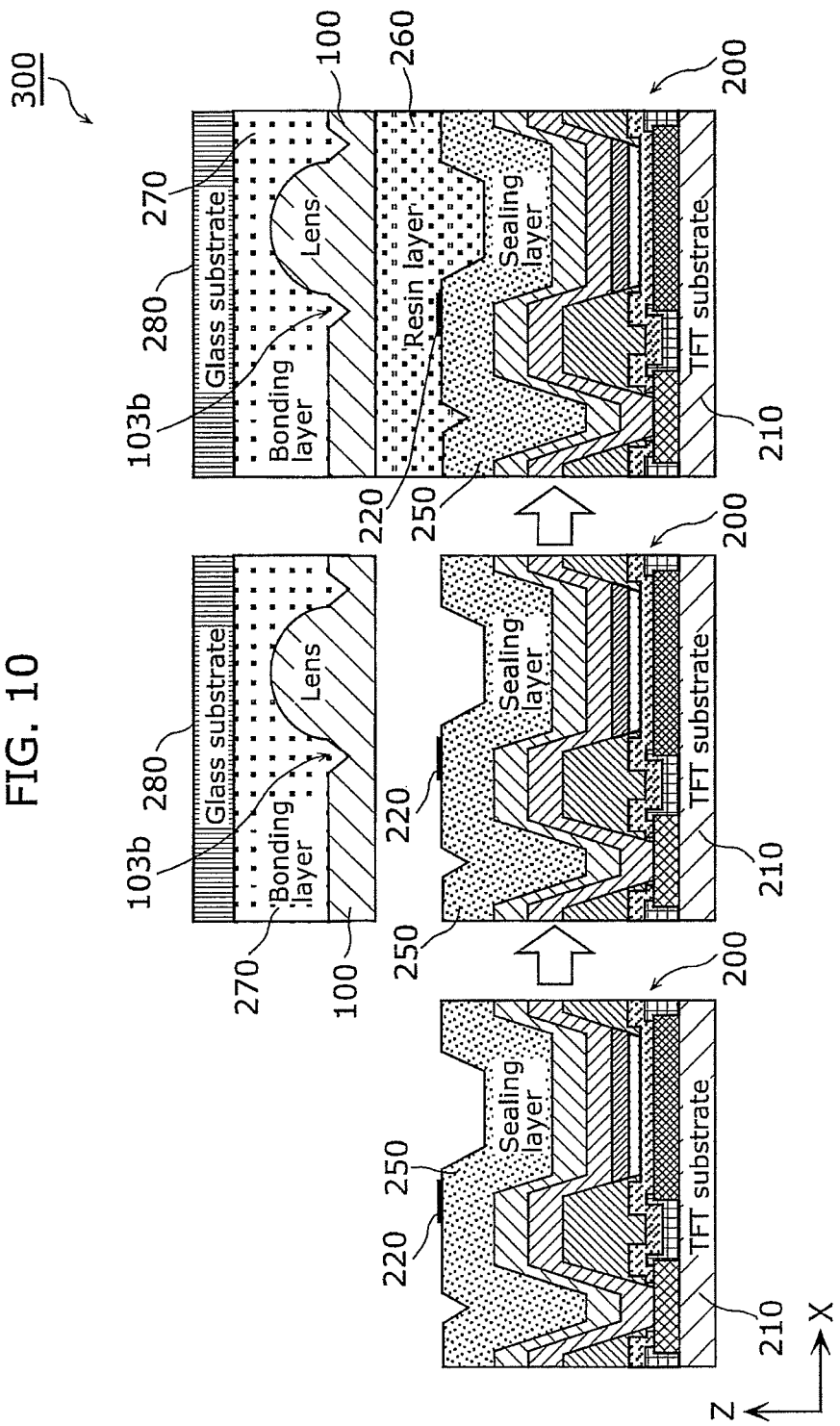
FIG. 10 shows an example of a manufacturing process of the display panel apparatus according to the embodiment of the present invention.
Figure 11:
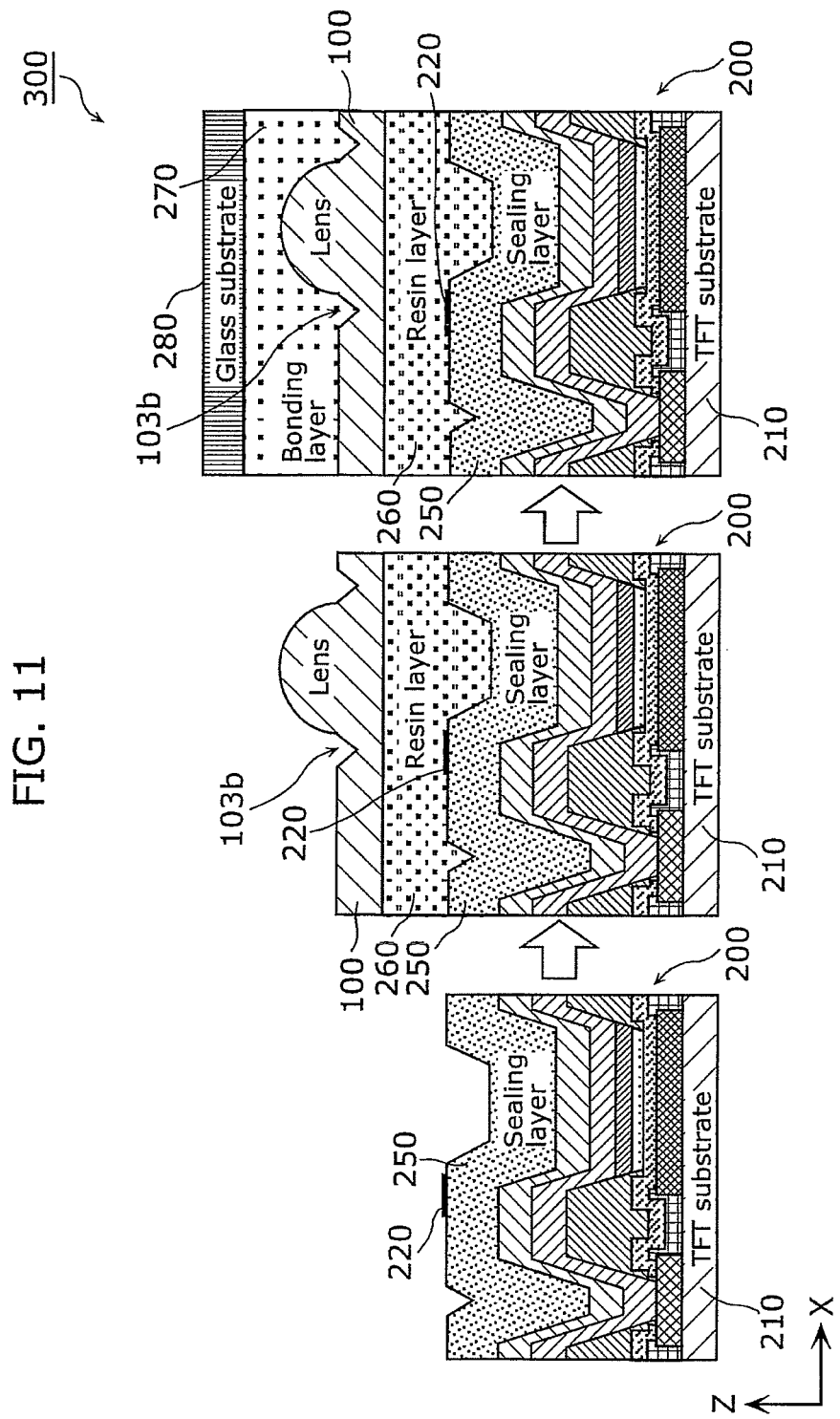
FIG. 11 shows another example of the manufacturing process of the display panel apparatus according to the embodiment of the present invention.

The display panel apparatus 300 configured as shown in FIG. 9 is manufactured in a process shown in FIG. 10 or FIG. 11, for example.

FIG. 10 shows an example of a manufacturing process of the display panel apparatus 300 according to the embodiment of the present invention.

As shown in FIG. 10, the structure up to the sealing layer 250, which includes the organic EL unit 200 having the organic luminescent layer 204, is formed above the TFT substrate 210. Separately from the above structure, the lens sheet 100 and the glass substrate 280 are bonded via the bonding layer 270.

Furthermore, the TFT substrate 210 on which the elements up to the sealing layer 250 have been formed is joined, via the resin layer 260, to the structure which includes the elements from the lens sheet 100 to the glass substrate 280.

In this final joining, the groove 103b serving as the alignment mark on the lens sheet 100 side is aligned in the X-axis direction with the alignment mark 220 on the TFT substrate 210 side. Alternatively, after this joining, it is checked whether or not the groove 103b and the alignment mark 220 are aligned in the X-axis direction.

FIG. 11 shows another example of the manufacturing process of the display panel apparatus 300 according to the embodiment of the present invention.

As shown in FIG. 11, the elements up to the sealing layer 250 are stacked on the TFT substrate 210. To the sealing layer 250, a resin is applied on which the elements from the lens sheet 100 to the glass substrate 280 are then stacked. That is, the display panel apparatus 300 is manufactured by sequentially stacking the constituent elements on the TFT substrate 210 in the order from the lowest layer.

In this manufacturing process, when the lens sheet 100 and the TFT substrate 210 on which the elements up to the sealing layer 250 have been formed are joined after the resin is applied to the top surface of the sealing layer 250, the groove 103b and the alignment mark 220 are aligned in the X-axis direction. Alternatively, after this joining, it is checked whether or not the groove 103b and the alignment mark 220 are aligned in the X-axis direction.

As above, the display panel apparatus 300 is manufactured in the process as shown in FIG. 10 or FIG. 11, and in this process, the lens sheet 100 and the TFT substrate 210 are aligned. In other words, the lens 102 is aligned with the organic luminescent layer 204.

While the alignment in the X-axis direction only is described above with reference to FIGS. 10 and 11, alignment in the Y-axis direction is also carried out likewise.

Figure 12:
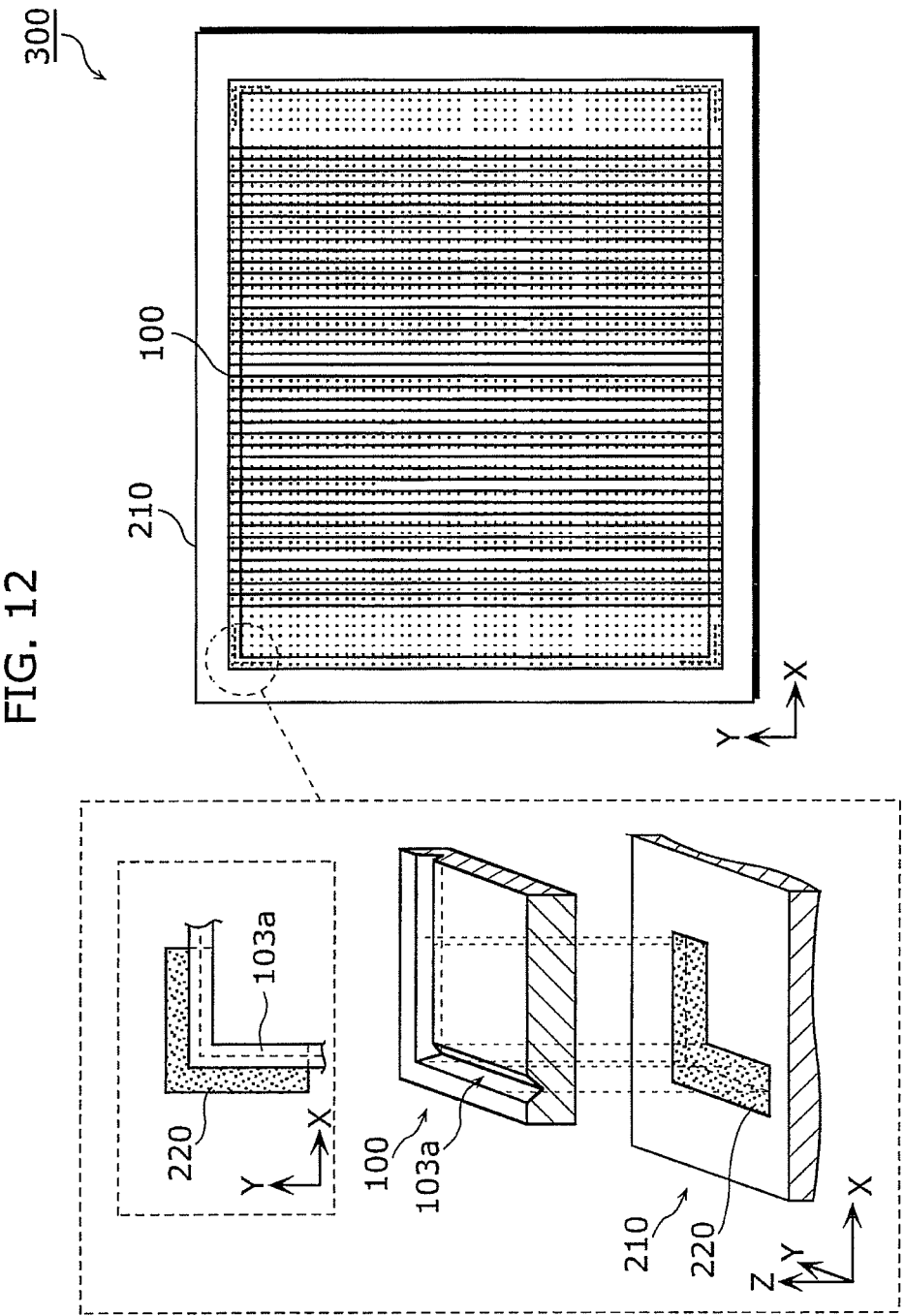
FIG. 12 is the first schematic diagram for explaining alignment of the lens sheet and the substrate in the embodiment of the present invention.

FIG. 12 is the first schematic diagram for explaining alignment of the lens sheet 100 and the TFT substrate 210 in the embodiment of the present invention.

As shown in FIG. 12, the groove 103a that is bent at a right angle is formed at each of the four corners of the lens sheet 100.

On the TFT substrate 210, the alignment mark 220 having a shape bent at a right angle is placed at a position corresponding to each of the four corners of the lens sheet 100. The alignment mark 220 bent at a right angle, shown in FIG. 12, may either be applied to an element formed on the TFT substrate 210 or be directly applied to the TFT substrate 210.

For example, the position of the lens sheet 100 relative to the TFT substrate 210 is determined so that these four alignment marks 220 overlap with the respective grooves 103a at the four corners of the lens sheet 100 as shown in FIG. 12.

In principle, this completes the alignment of the TFT substrate 210 with the lens sheet 100 in the X-axis direction and in the Y-axis direction. Furthermore, in this state, the TFT substrate 210 and the lens sheet 100 are joined.

It is then checked whether or not the groove 103b formed on the side of any one of the lenses 102 included in the lens sheet 100 is aligned (overlaps as predetermined), in the X axis direction, with the alignment mark 220 for the groove 103b.

Figure 13:
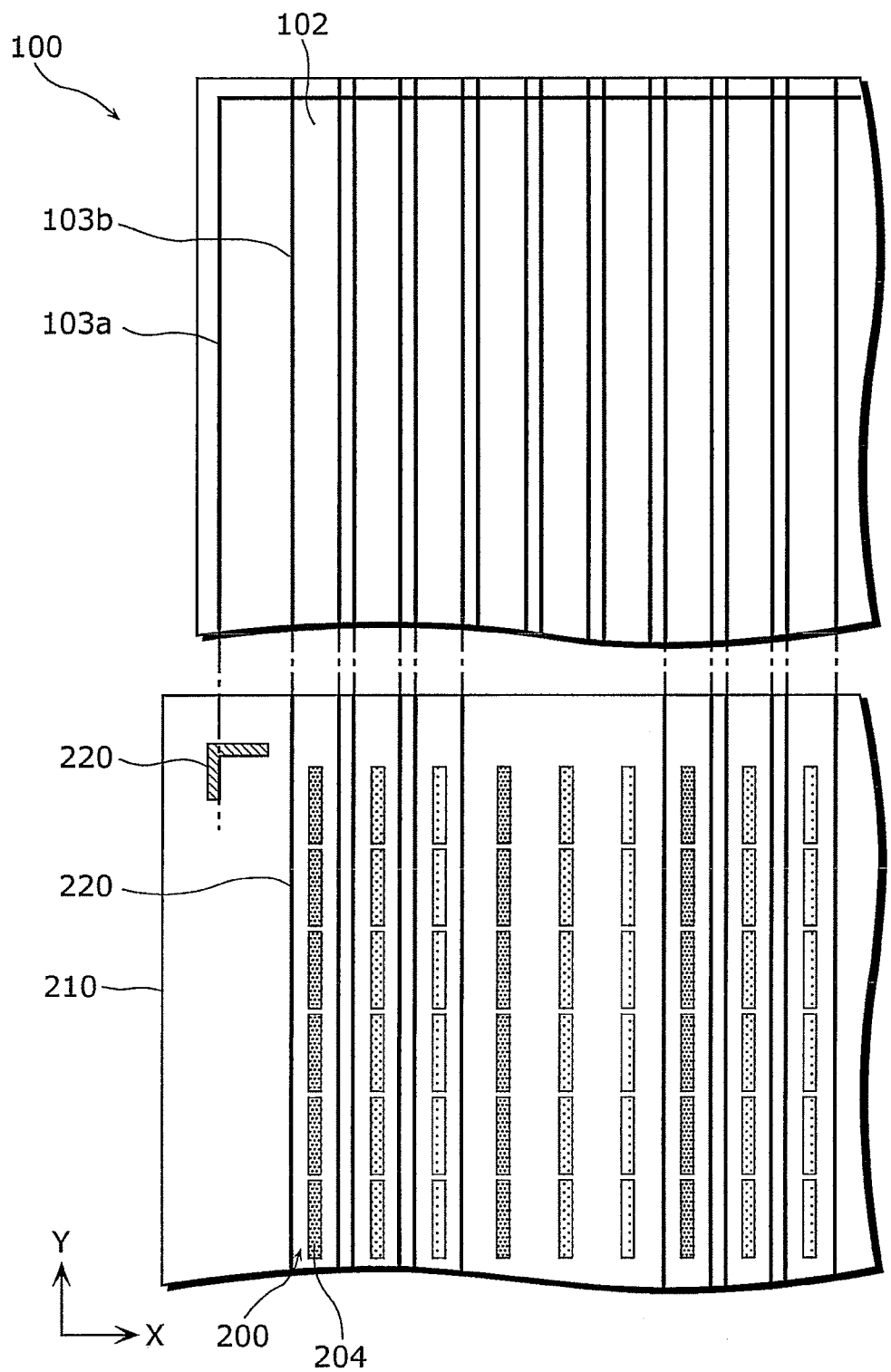
FIG. 13 is the second schematic diagram for explaining alignment of the lens sheet and the substrate in the embodiment of the present invention.

FIG. 13 is the second schematic diagram for explaining alignment of the lens sheet 100 and the TFT substrate 210 in the embodiment of the present invention.

FIG. 13 shows an enlarged diagram of corresponding corners of the lens sheet 100 and the TFT substrate 210.

As shown in FIG. 13, the grooves 103b are formed on both sides of each of the lenses 102 included in the lens sheet 100. Furthermore, the organic EL units 200 each including the organic luminescent layer 204 are arranged in a matrix on the TFT substrate 210.

The organic luminescent layers 204 which belong to the same column in the Y-axis direction emit light of the same color. For example, a column of layers which emit red light, a column of layers which emit green light, and a column of layers which emit blue light are arranged repeatedly in this order from the left to the right edge in FIG. 13.

One column of the organic luminescent layers 204 in the Y-axis direction is hereinafter referred to as "pixel column".

Assuming that a pixel column which emits red light, a pixel column which emits blue light, and a pixel column which emits green light constitute a single unit, the alignment mark 220 is placed, for example, on both the right and the left sides of each of the pixel columns in every other unit as shown in FIG. 13.

These alignment marks 220 on the sides of the pixel columns are provided so as to correspond to the respective grooves 103b formed in the lens sheet 100, as shown in FIG. 13.

Accordingly, for example, as described above with reference to FIG. 12, after the alignment based on the groove 103a at each of the corners of the lens sheet 100 and the alignment mark 220 at each of the corners of the TFT substrate 210, it is checked whether or not the alignment mark 220 on the left or the right side of at least one pixel column is aligned with the groove 103b which corresponds to the alignment mark 220 so that it is ultimately checked whether or not the lens sheet 100 and the TFT substrate 210 are accurately aligned.

Alternatively, one groove 103b on the side of the lens 102 is aligned first with the alignment mark 220 which corresponds to the groove 103b, and the ultimate check for whether or not the alignment has been accurate is performed by checking the overlap of the grooves 103a at the four corners of the lens sheet 100 with the alignment marks 220 at the four corners of the TFT substrate 210.

As above, in aligning the lens sheet 100 with the TFT substrate 210 above which the organic EL unit 200 and the like are formed, the grooves 103a and 103b are used as the alignment marks on the lens sheet 100 side.

These grooves 103a and 103b, unlike the conventional ones, do not protrude but are recessed in a direction opposite to a direction in which images are captured for optical recognition (for example, a direction towards a camera).

The images of the grooves 103a and 103b therefore have reduced blur or like troubles and are easily recognized unlike the conventional protruding alignment marks.

Specifically, in the present embodiment, the sheet base 101 and the lens 102 are formed of the same material (for example, an acrylic resin) as described above.

Thus, the sheet base 101 is light transmissive. Consequently, the light incident on the grooves 103a and 103b is reflected on the wall surface defining each of the grooves 103a and 103b, while passing through the sheet base 101 in an area other than the grooves 103a and 103b.

An amount of the incident light transmitted by the sheet base 101 is therefore different from the grooves 103a and 103b to the other area, which allows for a clear discrimination between the grooves 103a and 103b and the other area. As a result, the recognition of the images of the grooves 103a and 103b as the alignment marks on the lens sheet 100 side becomes easy, which can improve the accuracy of alignment of the lens sheet 100 and the TFT substrate 210.

A cross-section of each of the grooves 103a and 103b, which is perpendicular to the lengthwise direction of thereof, is in the shape of an isosceles triangle with a vertex angle of 90 degrees.

Figure 14:
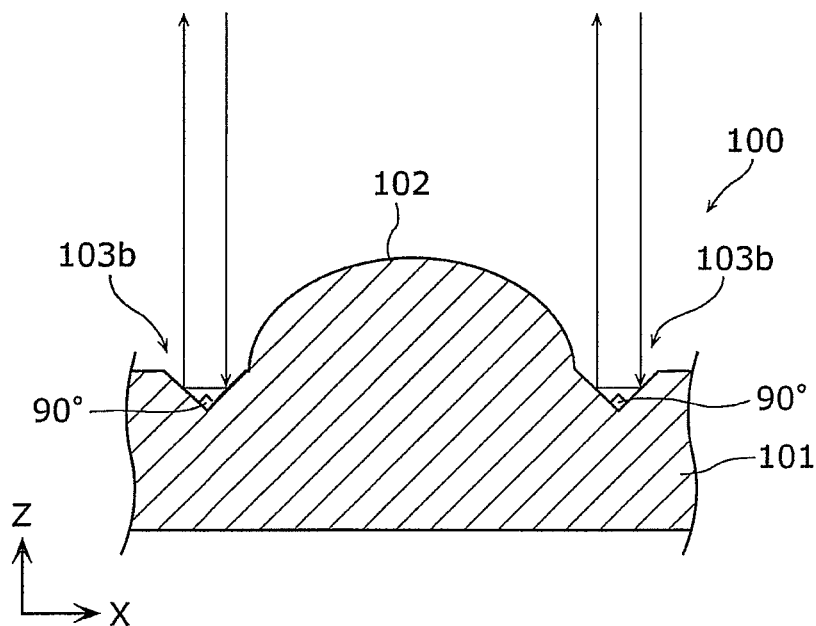
FIG. 14 shows an example of a cross-sectional profile of the grooves in the embodiment of the present invention.

FIG. 14 shows an example of a cross-sectional profile of the grooves 103b in the embodiment of the present invention.

A cross-section of the groove 103b, which is perpendicular to the lengthwise direction (Y-axis direction) thereof, that is, the cross-section of the groove 103b, which is parallel to the X-Z plane, is in the shape of an isosceles triangle with a vertex angle of 90 degrees.

In this case, the light entering from outside is reflected on one of the inclines of the isosceles triangle, and this reflected light is reflected on the other one of the inclines. As a result, the light can return in a direction to where it originally entered.

That is, the groove 103b can totally reflect incident light in its incident direction. It is therefore possible to emit very bright light towards a camera or the like which captures an image of the groove 103b. As a result, the groove 103b is clearly recognized, which can improve the accuracy of alignment of the lens sheet 100 and the TFT substrate 210.

The groove 103a has the same cross-sectional profile as the groove 103b and therefore is optically recognized with ease.

It goes without saying that the cross-sectional profile of each of the grooves 103a and 103b is not limited to the profile shown in FIG. 14 and that the wall surface defining each of the grooves 103a and 103b may be a curved surface. Furthermore, the grooves 103a and 103b may have different cross-sectional profiles.

In addition, in the lens sheet 100 according to the present embodiment, the wall surface defining the groove 103b is continuous with the surface of the lens 102 as described above.

However, there may be a discontinuity between the wall surface defining the groove 103b and the surface of the lens 102.

Figure 15:
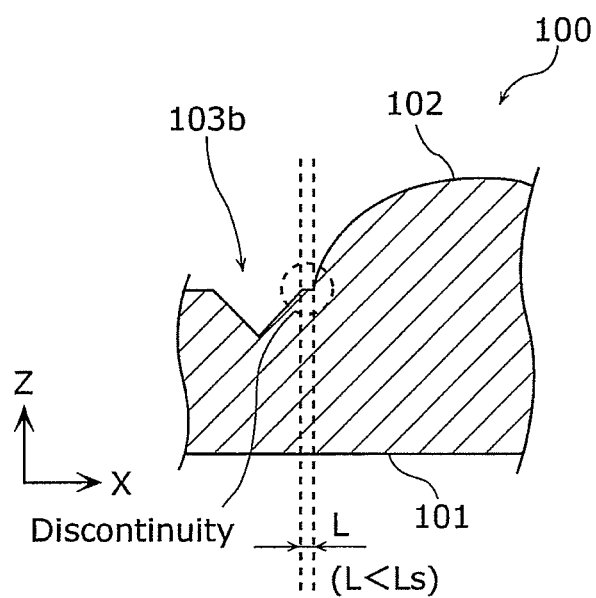
FIG. 15 shows an example of a cross-section of the lens sheet with a discontinuity between a wall surface defining the groove and a surface of the lens.

FIG. 15 shows an example of a cross-section of the lens sheet 100 with a discontinuity between the wall surface defining the groove 103b and the surface of the lens 102.

As shown in FIG. 15, there is a certain distance (denoted by L in FIG. 15) between an end edge, on the surface side of the sheet base 101, of the wall surface defining the groove 103b, and an end of a region in which the lens 102 is provided, and this results in the discontinuity.

Even in the case where there is the discontinuity as above, generation of bubbles at the discontinuity can be prevented when the distance L is set to be equal to or less than a predetermined length (denoted by Ls in FIG. 15).

In this case, Ls is, for example, half the minimum diameter of a bubble which can be generated in the bonding layer 270. This minimum diameter of the bubble which can be generated may be determined by experiment. Alternatively, it may be calculated based on the viscosity of a resin of the bonding layer 270, the atmosphere temperature at which the resin is applied to the lens sheet 100, the wettability of the lens sheet 100, and other factors.

When the groove 103b is thus formed within a predetermined range, which is determined by experiment or the like as above, from an end of the region in which the lens 102 is provided, the resin can be guided along the surface of the lens 102 and fall in the groove 103b by downward force. As a result, it is possible to prevent bubbles from being generated in the boundary area (at the discontinuity in FIG. 15) between the sheet base 101 and the lens 102.

Furthermore, the display panel apparatus 300 according to the embodiment of the present invention described above is, for example, incorporated in a display apparatus such as a television and functions as an apparatus for displaying images received by the display apparatus.

Figure 16:
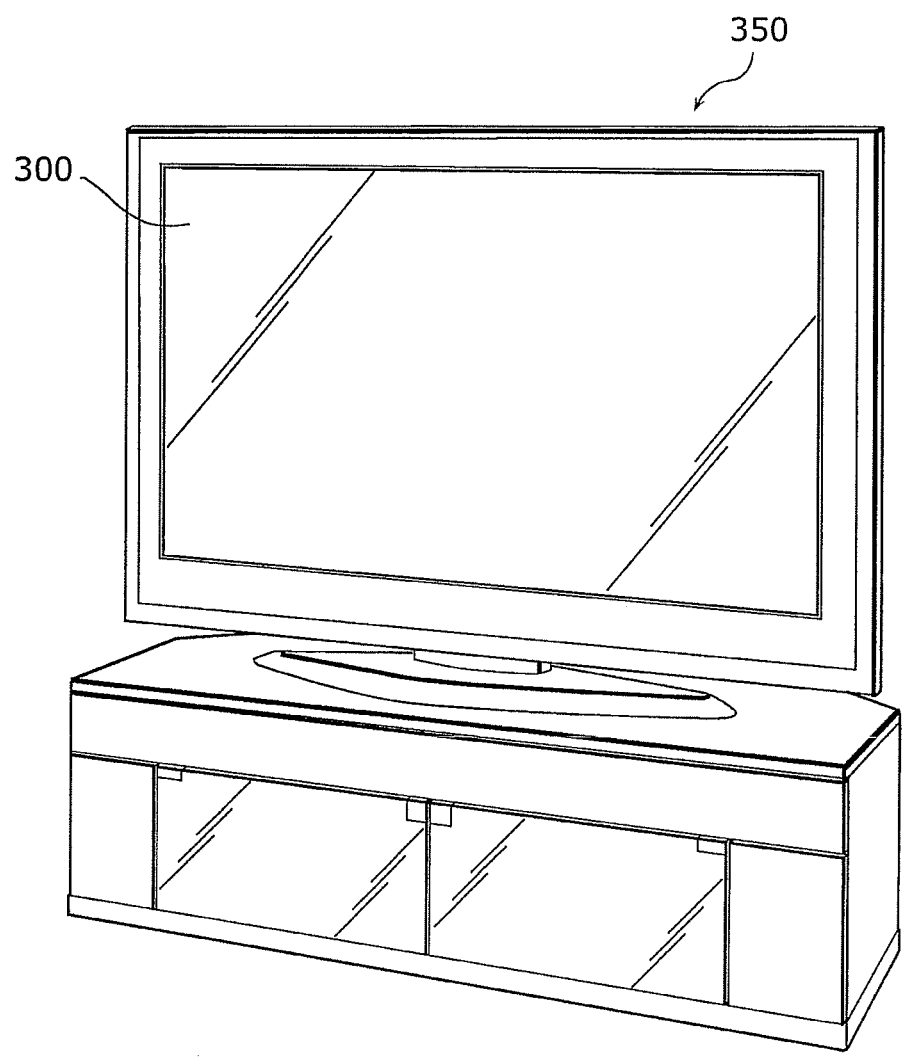
FIG. 16 is an external view of a display apparatus according to the embodiment of the present invention.

FIG. 16 is an external view of a display apparatus 350 according to the embodiment of the present invention.

The display apparatus 350 according to the embodiment of the present invention incorporates the above-described display panel apparatus 300. The display apparatus 350 is capable of providing viewers with clear images because of structural characteristics of the display apparatus 300 and the lens sheet 100 included in the display panel apparatus 300.

The lens sheet, the display panel apparatus, and the display apparatus according to an implementation of the present invention have been described above based on the embodiment. However, the present invention is not limited to the above embodiment. The scope of the present invention includes other embodiments that are obtained by making various modifications that those skilled in the art could think of, to the present embodiment, or by combining constituents described above, without departing from the spirit of the present invention.

The embodiment disclosed herein is illustrative in all aspects and should not be construed as limiting. The scope of the present invention is defined by not the above descriptions but the claims and intended to include all modifications within the literal and equivalent scope of the claims.

For example, in the present embodiment, one lens 102 is formed so as to cover all the luminescent layers included in one pixel column. However, the lenses 102 may be provided in the lens sheet 100 so that one lens 102 corresponds to each of the luminescent layers or each set of the luminescent layers.

Furthermore, the cross-sectional profile of the lens 102, which is perpendicular to the lengthwise direction thereof, may be in the form other than the elliptical arc. The profile may be in any form as long as the light emitted from the luminescent layer can be efficiently extracted. For example, the cross-sectional profile may be defined at an upper part by a curve and at a part close to the surface of the sheet base 101 by a straight line.

Even with the above profile, the effect of preventing generation of bubbles by the groove 103b can be exhibited.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

Industrial Applicability

The present invention can provide a lens sheet which can be aligned accurately with another member with the desired light-extraction efficiency maintained, and provide a display panel apparatus and a display apparatus which use the lens sheet. That is, the present invention is useful as a lens sheet, a display panel apparatus, and a display apparatus, for providing viewers with clear images.

What is claimed is:

1. A display panel apparatus, comprising:
    a substrate;
    organic electroluminescence units, each of which includes a first electrode above said substrate, a second electrode that is a transparent electrode, and an organic luminescent layer between said first electrode and said second electrode;
    a lens sheet including a sheet base and lenses, said sheet base being outside said second electrode in a first direction of light emitted from said organic luminescent layer, said lenses being respectively provided for said organic electroluminescence units and protruding from a first surface of said sheet base;
    a transparent substrate above said lens sheet; and
    a bonding layer across a top surface of said lens sheet and including a resin for providing a flat surface over an unevenness resulting from said lenses and for bonding said lenses and said transparent substrate,
    wherein one of said substrate and said organic electroluminescence units has an alignment mark for aligning said substrate with said lens sheet,
    said lens sheet has a groove between said lenses in said sheet base and recessed from the first surface of said sheet base in a second direction opposite to a third direction in which said lenses protrude, and
    said groove between said lenses is for alignment with said alignment mark, the resin covers a second surface of each of said lenses and is in said groove, and a boundary area between said sheet base and each lens of said lenses is covered by the resin, the boundary area being located between the second surface of said lens and said groove.

2. The display panel apparatus according to claim 1, wherein the resin extends along the second surface of said lens so that the resin covers the boundary area between said sheet base and said lens.

3. The display panel apparatus according to claim 1, wherein said groove has a cross-section in a shape of an isosceles triangle with a vertex angle of 90 degrees, the cross-section being perpendicular to a lengthwise direction of said groove.

4. The display panel apparatus according to claim 1, wherein the second surface of said lens is continuous with a wall surface defining said groove.

5. The display panel apparatus according to claim 1, wherein said groove is at a position such that a distance between an end edge, on a surface side of said sheet base, of a wall surface defining said groove, and an end of a region in which said lens is provided, is at most equal to a predetermined distance.

6. The display panel apparatus according to claim 1, wherein said sheet base comprises a same material as said lenses.

7. The display panel apparatus according to claim 1, wherein said sheet base has a first refractive index greater than a second refractive index of said bonding layer.

8. The display panel apparatus according to claim 1, wherein each of said lenses has an elongated shape when viewed in a top plan, a cross-section of said lens, which is perpendicular to a lengthwise direction of said lens, is an elliptical arc having a predetermined curvature, and a proportion of a height from a basal plane to a vertex of said lens to a semi-minor axis of the basal plane of said lens is at least 0.8 and at most 1.2.

9. The display panel apparatus according to claim 1, wherein each of said organic electroluminescence units further includes a sealing layer above said second electrode, and said alignment mark is on said sealing layer.

10. The display panel apparatus according to claim 1, wherein said alignment mark is on a second top surface of said substrate.

11. The display panel apparatus according to claim 1, wherein each of said organic electroluminescence units further includes a hole injection layer between said organic luminescent layer and said first electrode.

12. A display apparatus, comprising:
    said display panel apparatus according to claim 1,
    wherein said organic electroluminescence units are in a matrix.

13. A method of manufacturing a display panel apparatus, comprising:
    forming, above a substrate, organic electroluminescence units, each of which includes a first electrode, a second electrode that is a transparent electrode, and an organic luminescent layer between the first electrode and the second electrode;
    forming, above the second electrode, a sealing layer for sealing the organic electroluminescence units;
    providing, above the sealing layer, a lens sheet including a sheet base and lenses, the lenses respectively provided for the organic electroluminescence units and protruding from a first surface of the sheet base; and
    bonding the sealing layer and the lens sheet by injecting an adhesive into a top surface of the sealing layer,
    wherein one of the substrate and the organic electroluminescence units has an alignment mark for aligning the substrate with the lens sheet,
    the lens sheet includes a groove previously formed between the lenses in the sheet base and recessed from the first surface of the sheet base in a first direction opposite to a second direction in which the lenses protrude, and
    the groove previously formed between the lenses is used for alignment with the alignment mark when bonding the sealing layer and the lens sheet, a resin covers a second surface of each of the lenses and is filled into the groove, and a boundary area between the sheet base and each lens of the lenses is covered by the resin, the boundary area being located between the second surface of the lens and the groove.

* * * * *